(12) United States Patent
Healy

(10) Patent No.: US 11,424,200 B2
(45) Date of Patent: Aug. 23, 2022

(54) COUPLING OF INTEGRATED CIRCUITS (ICS) THROUGH A PASSIVATION-DEFINED CONTACT PAD

(71) Applicant: Cirrus Logic International Semiconductor Ltd., Edinburgh (GB)

(72) Inventor: Christopher Healy, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 17/081,945

(22) Filed: Oct. 27, 2020

(65) Prior Publication Data

US 2022/0130778 A1 Apr. 28, 2022

(51) Int. Cl.
*H01L 21/78* (2006.01)
*H01L 23/00* (2006.01)

(52) U.S. Cl.
CPC .............. *H01L 24/03* (2013.01); *H01L 21/78* (2013.01); *H01L 24/06* (2013.01); *H01L 24/09* (2013.01); *H01L 24/11* (2013.01); *H01L 24/14* (2013.01); *H01L 24/32* (2013.01); *H01L 24/83* (2013.01); *H01L 2224/0225* (2013.01); *H01L 2224/02175* (2013.01); *H01L 2224/0391* (2013.01); *H01L 2224/0401* (2013.01); *H01L 2224/09132* (2013.01); *H01L 2224/11849* (2013.01); *H01L 2224/14133* (2013.01); *H01L 2224/32265* (2013.01); *H01L 2224/83815* (2013.01); *H01L 2924/14253* (2013.01)

(58) Field of Classification Search
CPC ........ H01L 24/03; H01L 21/78; H01L 24/06; H01L 24/09; H01L 24/11; H01L 24/14; H01L 24/32; H01L 24/83; H01L 2224/02175; H01L 2224/0225; H01L 2224/0391; H01L 2224/0401; H01L 2224/09132; H01L 2224/11849; H01L 2224/14133; H01L 2224/32265; H01L 2224/83815; H01L 2924/14253
USPC ......................................................... 257/738
See application file for complete search history.

(56) References Cited

U.S. PATENT DOCUMENTS

| | | | |
|---|---|---|---|
| 7,391,118 B2 | 6/2008 | Tsai | |
| 7,576,426 B2 | 8/2009 | Gan et al. | |
| 7,919,860 B2 | 4/2011 | Murugan et al. | |
| 9,324,687 B1 | 4/2016 | Kelkar et al. | |
| 2007/0087471 A1* | 4/2007 | Yang | H01L 25/50 257/E21.705 |
| 2014/0210081 A1* | 7/2014 | Lin | H01L 25/16 257/738 |

* cited by examiner

*Primary Examiner* — Didarul A Mazumder
(74) *Attorney, Agent, or Firm* — Norton Rose Fulbright US LLP

(57) ABSTRACT

Components may be placed on an active side of a wafer as part of wafer-level chip scale packaging (WLCSP) for use in electronic devices. Pad layouts for the components on an active side of a wafer may be passivation-defined by forming a conductive terminal over a first dielectric layer and a forming a passivating, second dielectric layer over the conductive terminal. Openings formed in the second dielectric layer define component contacts to the conductive terminal and circuitry on the wafer coupled to the conductive terminal. Trenches may be used between pairs of contact pads to further reduce issues resulting from short circuits and/or underfills. A conductive pad may further be deposited in the opening to form underbump metallization (UBM) for coupling the component to the wafer.

18 Claims, 8 Drawing Sheets

COUPLING OF INTEGRATED CIRCUITS (ICS) THROUGH A PASSIVATION-DEFINED CONTACT PAD

FIELD OF THE DISCLOSURE

The instant disclosure relates to integrated circuits. More specifically, portions of this disclosure relate to coupling integrated circuits with components.

BACKGROUND

An integrated circuit (IC) is a collection of circuits manufactured on a common substrate, such as a collection of transistors on a semiconductor substrate. The capabilities of ICs continue to increase, with the increased capability provided in part by reducing the size of aspects of the ICs to allow more complex ICs to be manufactured in the die space. ICs may use discrete passive components, separate from components within circuitry manufactured on the semiconductor substrate, to improve certain operating characteristics of the ICs. The discrete passive components must be electrically coupled to the ICs. In one conventional technique, the passive components are coupled to a printed circuit board (PCB), and also attached to the PCB is the IC such that a conductive trace through the PCB couples the IC to the component. However, challenges arise in finding space on the PCB for the components and routing traces through the PCB for the components. The decreasing size of devices that house the PCB result in decreased space on the PCB for components and traces. These challenges are further complicated when component placement is taken into consideration because the PCB can introduce parasitics that reduce performance proportional to a distance on the PCB between the component and the IC.

Shortcomings mentioned here are only representative and are included simply to highlight that a need exists for improved electrical components, particularly for integrated circuits with passive components that are employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

Components may be placed on an active side of a wafer for use in electronic devices. Coupling of components on the active side may be achieved through contact pads formed on the active side of the wafer. The contact pads may be located at a top of a stack of materials on the active side of the wafer, such as device layers used to form transistors on the wafer and metallization layers used to interconnect the transistors. The contact pads facilitate the coupling of the transistors to the components, which may be larger in size than the transistors.

Layouts for the contact pads for components on an active side of a wafer may be passivation-defined. For example, a conductive terminal may be formed over a first dielectric layer and a passivating, second dielectric layer formed over the conductive terminal. Openings formed in the second dielectric layer define a contact region for the conductive terminal and components may then be coupled to a contact pad defined by the remaining passivation layer. Trenches may be used between pairs of contact pads to reduce issues resulting from short circuits and/or underfills when coupling components to the contact pads. A conductive pad may be deposited in the opening to form underbump metallization (UBM) for coupling the component to circuitry on the wafer.

Placement of components on the active side of the wafer may reduce the number of components on the PCB, which may allow a reduction in a size of the PCB and may reduce parasitic capacitance resulting from conductors traversing the PCB to couple to the component. A smaller PCB may allow design of smaller electronic devices, such as smaller mobile phones.

The pad layouts for components on an active side of a wafer and manufacturing techniques for forming the pad layouts on an active side of wafer disclosed in embodiments herein reduce stand-off height, which may reduce a thickness of electronic devices incorporating circuitry with contact pads described in embodiments of this disclosure. Further, embodiments of the contact pads described herein may improve electrical coupling to the components and reduce yield issues resulting from short circuits and/or underfills when coupling to the components, which may improve performance of electronic devices and may decrease costs of the electronic devices.

In some embodiments, an apparatus may include a substrate; a first dielectric layer on the substrate; conductive terminals on the first dielectric layer; a second dielectric layer on the first dielectric layer and on the conductive terminals; and openings in the second dielectric layer above the conductive terminals forming contact pads for external components. Components may be coupled to the contact pads on the active side of the wafer. Examples of components that may be coupled include passive components such as resistors, capacitors, and inductors. One example advantage of the contact pad structure is that the second dielectric layer reduces the chance of shorting two contact pads through errant solder paste, which thus improves yield of usable ICs from the substrate. The substrate may be a silicon substrate comprising circuitry made of arrangements of transistors and/or other components organized as processing circuitry or memory that couple to components through the contact pads. For example, the circuitry may couple to a component through the contact pads when a capacitance is used in the circuitry for achieving a particular performance level.

A method for manufacturing an apparatus, such as a semiconductor integrated circuit (IC), may include depositing a first dielectric layer on an active side of a wafer; forming conductive terminals on the active side of the wafer after depositing the first dielectric layer; depositing a second dielectric layer on the active side of the wafer to passivate the conductive terminals; patterning openings in the second dielectric layer to expose the conductive terminals, wherein the openings define contact pads for components; coupling components to pairs of the contact pads on the active side of the wafer; and/or dividing the wafer into a plurality of chips after coupling the components to the contact pads.

Electronic devices incorporating embodiments of integrated circuits (ICs) with components as described herein and manufactured according to embodiments described herein may benefit from improved sound quality, improved video quality, improved processing capabilities, reduced manufacturing cost, and/or reduced size by providing higher quality electrical couplings to components that may be located closer to the ICs. ICs of the electronic devices may include an audio controller having mixed signal circuitry (e.g., digital domain and analog domain circuitry) that employs passive components to provide functionality for an analog-to-digital converter (ADC), a digital-to-analog converter (DAC), an audio filter, and/or an audio amplifier. Such an audio controller may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
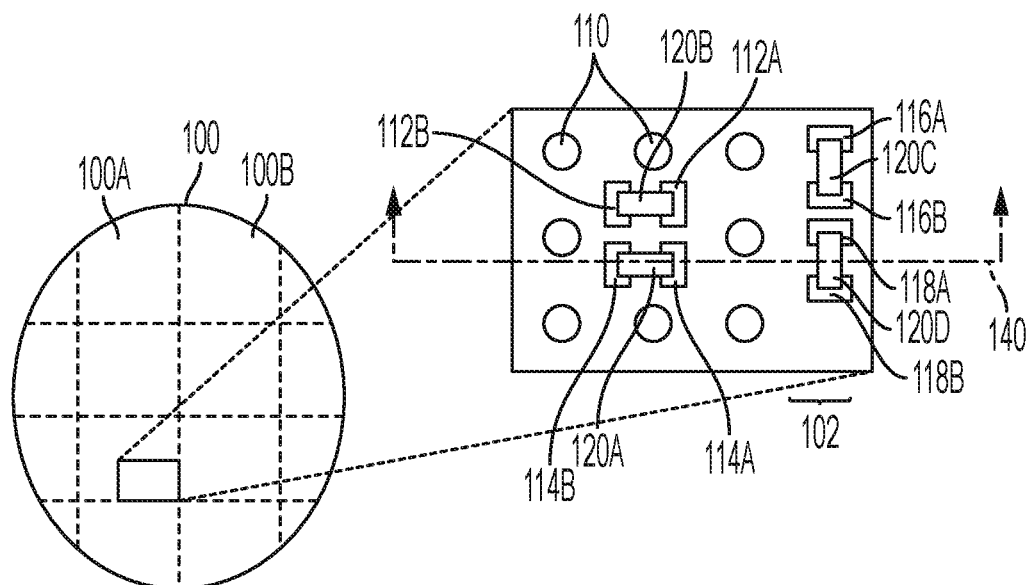
FIG. 1 is a top-down view of a portion of an example wafer having components coupled to pairs of the contact pads on an active side of the wafer according to embodiments of the disclosure.

FIG. 1 is a top-down view of a portion of an example wafer having components coupled to pairs of the contact pads on an active side of the wafer according to embodiments of the disclosure. A wafer 100 may have formed thereon circuitry on a semiconductor layer. The circuitry may be repeated across the wafer to form multiple dies 100A, 100B, and others. The wafer 100 may have tens or hundreds of dies corresponding to separate integrated circuits (ICs) depending on a size of the IC and a size of the wafer 100. The dies 100A and 100B may have components electrically coupled thereto through contact pads on an active side of the wafer 100. The active side refers to a side of the wafer 100 on which the circuitry is formed through manufacturing techniques such as implantation, deposition, patterning, and etching. For example, implantation may be used to form source and drain regions on an active side of the wafer 100, and deposition, patterning, and etching may be used to build a gate region between the source and drain regions and interconnects and other metal layers to connect the source, drain, and gate regions in a particular manner to form logic or memory devices on the active side of the wafer 100.

A blow-up of one portion of a die from the wafer 100 is shown to illustrate the coupling of components to the IC on the active side of the wafer 100. For example, component 120A may be coupled to contact pads 114A, 114B, and component 120B may be coupled to contact pads 112A, 112B. The contact pads 112A, 112B, 114A, and 114B couple the components 120A and 120B to circuitry (not shown) on the active side of the wafer 100. The components 120A and 120B may be smaller in size than an outer dimension of corresponding pairs of the openings that contain the contact pads to which the components are coupled. The components 120A-B are in a non-edge portion of the die 100B surrounded by packaging connections 110. The packaging connections 110 couple the die 100B to other components in a device, such as other ICs on other dies. One example of packaging connection is underbump metallization (UBM) in which each of the connections 110 is a solder ball.

One or more of the connections 110 are depopulated to provide space for components 120A and 120B. A depopulated connection may refer to a connection that is formed and later removed or may refer to a connection in a grid that was never formed such that the grid pattern is non-repeating on a portion of the wafer 100. For example, the connections 110 may form a repeating grid of spaced solder balls, but one of the solder balls may be omitted and contact pads 112A, 112B, 114A, and 114B formed in place of the depopulated connection. In some embodiments, the contact pads 112A and 112B may be sized to fit in an arrangement having two components for each location in a grid of packaging connections 110. In some embodiments, the size may correspond to 008004-type components.

In addition to or in alternatively to the components 120A and 120B placed within the grid of connections 110, components 120C and 120D may be placed at an edge 102 of the IC. The edge 102 of the IC may correspond to an edge of the substrate that forms the die, or may correspond to an edge of the formed circuitry on that die, or may correspond to a region outside the grid of connections 110. The component 120C is coupled to circuitry through contact pads 116A and 116B, and the component 120D is coupled to circuitry through contact pads 118A and 118B.

Figure 2:
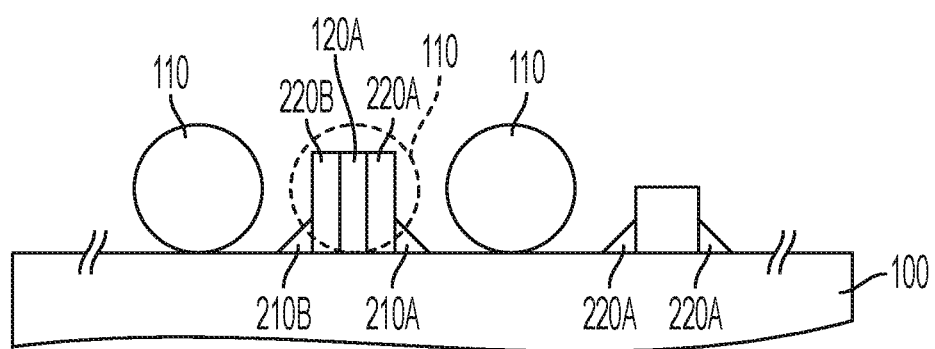
FIG. 2 is a cross-sectional view through an example wafer having components coupled to pairs of the contact pads on an active side of the wafer according to embodiments of the disclosure.

A cross-sectional view through line 140 of FIG. 1 is shown in FIG. 2. FIG. 2 is a cross-sectional view through of an example wafer having components coupled to pairs of the contact pads on an active side of the wafer according to embodiments of the disclosure. The component 120A may include electrical contacts 220A and 220B that are coupled to contact pads on the active side of the wafer 100. In some embodiments, solder 210A and 210B may mechanically affix and electrically couple the contacts 220A and 220B to contact pads 114A and 114B, respectively. The component 120D may likewise be mechanically affixed and electrically coupled to the contacts 118A and 118B by solder 220A.

Figure 3A:
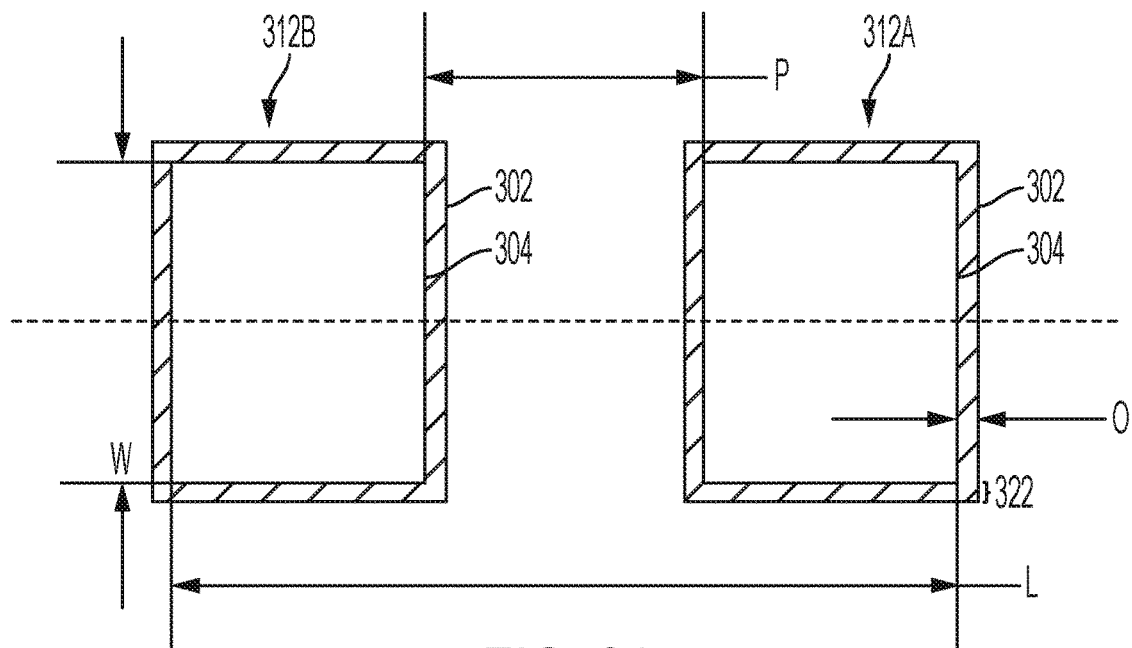
FIGS. 3A-B are a top-down view and a cross-sectional view, respectively, of example contact pads on an active side of the wafer according to embodiments of the disclosure.
Figure 3B:
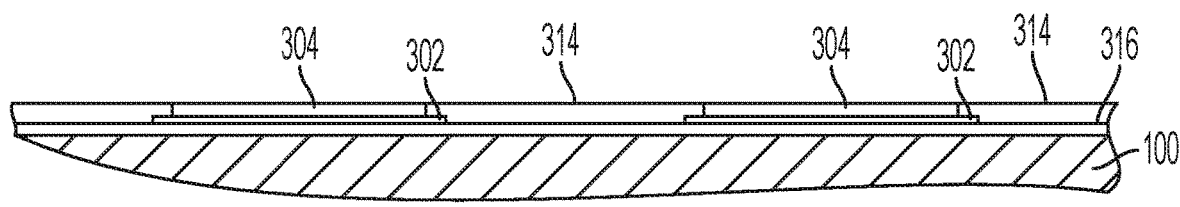

Example embodiments of the contact pads 112A, 112B, 114A, 114B, 116A, 116B, 118A, and 118B are shown in FIGS. 3A-B, FIGS. 4A-B, and FIGS. 5A-B. In some embodiments of wafer contacts pads from different embodiments may be used for different components coupled to the wafer. One embodiment of contact pads with a passivation-defined contact pad is shown in FIGS. 3A-B. FIGS. 3A-B are a top-down view and a cross-sectional view, respectively, of contact pads on an active side of the wafer according to embodiments of the disclosure. Contact pads 312A and 312B may correspond to, for example, contact pads 114A-B of FIG. 1 or contact pads 116A-B of FIG. 1. A cross-section of the contact pads 312A and 312B through the dashed line is shown in FIG. 3B.

A conductive terminal 302 is located over and on a first dielectric layer 316. The second dielectric layer 314 partially covers the conductive terminal 302 in overlap region 322. An opening 304 is formed in the second dielectric layer 314 to expose the conductive terminal 302, and the opening 304 provides an area through which a component can be electrically coupled to the conductive terminal 302. The conductive terminal 302 may be coupled to circuitry on the wafer through metal layers, including interconnects, trenches, and vias. The opening 304 in the second dielectric layer 314 defines the contact pads 312A and 312B. The second dielectric layer 314 may also be referred to as a passivation layer, thus the contact pads 312A and 312B may be described as passivation-defined.

Openings 304 may be formed in pairs to facilitate forming two contact pads for coupling to two terminals of a component. Each pair of contact pads 312A and 312B may be sized and spaced to facilitate coupling of different sizes of components. The contact pads 312A and 312B may be separated by a distance P on a wafer 100 through a first dielectric layer 316 and a second dielectric layer 314. Example distances for pad-to-pad opening P may be 10-1000 micrometers, 50-500 micrometers, 100-200 micrometers, or more particularly 100 micrometers for 008004-type components or 200 micrometers for 01005-type components. The pair of contact pads 312A and 312B may also be characterized by a dielectric opening total length L between an outside edge of opening 304 corresponding to contact pad 312B and an outside edge of opening 304 corresponding to contact pad 312A. Example distances for the dielectric opening total length L may be from 1.5 to 5 times the dimension P, from 2 to 3 times the dimension P, or more particularly, from between 2.5 to 3 times the dimension P for 01005-type components and between 3 to 3.5 times the dimension P for 008004-type components. The pair of contact pads 312A and 312B may further be characterized by a dielectric opening width W between opposing outside edges of opening 304 of one of the contact pads 312A and 312B. Example distances for the dielectric opening width W may be from 50-500 micrometers, 100-350 micrometers, or more particularly, 230 micrometers for a 01005-type component or 140 micrometers for a 008004-type component. The overlap region 322 may have an overlap width O between an edge of the conductive terminal 302 and the opening 304. Example widths for pad-to-dielectric opening O may be 5-500 micrometers, 10-100 micrometers, or more particularly, greater than 15 micrometers for 008004-type components or greater than 15 micrometers for 01005-type components.

The presence of the second dielectric layer 314 between different contact pads 312A and 312B reduces the likelihood of errant solder or other conductor from shorting the contact pad 312A to the contact pad 312B, and thus isolating electrical current through a component coupled between the contact pads 312A and 312B. The conductive terminal 302 may be made of copper or another metal. The metal height of the contact pad, and thus total stand-off height, may be reduced by defining the contact pads through the passivation opening rather than the metal pad.

Figure 4A:
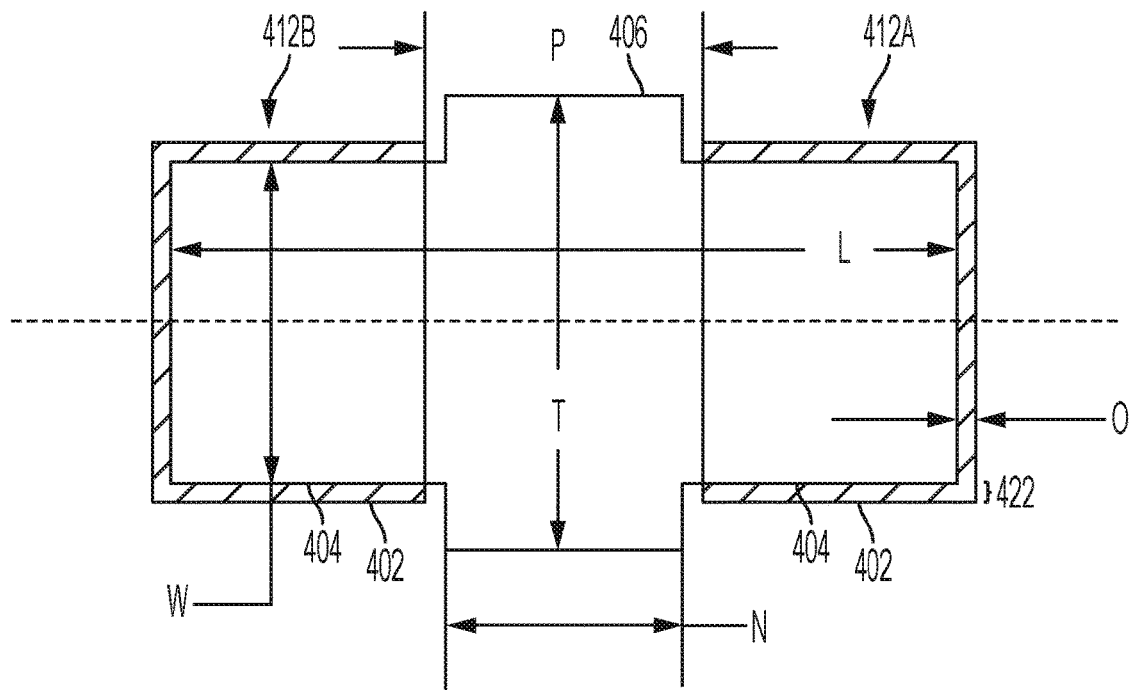
FIGS. 4A-B are a top-down view and a cross-sectional view, respectively, of example contact pads with a trench between the contact pads on an active side of the wafer according to embodiments of the disclosure.
Figure 4B:
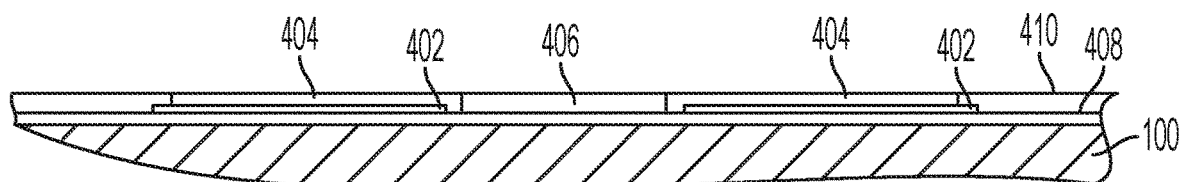

Another embodiment of passivation-defined contact pads is shown in FIGS. 4A-4B and includes a trench 406 between the contact pads 412A and 412B. FIGS. 4A-B are a top-down view and a cross-sectional view, respectively, of contact pads with a trench between the contact pads on an active side of the wafer according to embodiments of the disclosure. Contact pads 412A and 412B may correspond to, for example, contact pads 114A-B of FIG. 1 or contact pads 116A-B of FIG. 1. A cross-section through the contact pads 412A and 412B along the dashed line is shown as FIG. 4B.

A conductive terminal 402 is located over and on a first dielectric layer 408. A second dielectric layer 410 partially covers the conductive terminal 402 in overlap region 422. An opening 404 is formed in the second dielectric layer 410 to expose the conductive terminal 402. The opening 404 provides an area through which a component can be electrically coupled to the conductive terminal 402. The conductive terminal 402 may be coupled to circuitry on the wafer through conductive layers, including interconnects, trenches, and vias. The opening 404 in the second dielectric layer 410 defines the contact pads 412A and 412B. The second dielectric layer 410 may also be referred to as a passivation layer, thus the contact pads 412A and 412B may be described as passivation-defined.

Embodiments of the contacts pads 412A-B of FIGS. 4A-4B also include a trench 406 in which the second dielectric 410 is removed. The trench 406 may be formed in parallel with the openings 404, or may be formed during a separate photolithography and etching process. The trench 406 may allow a reduced standoff height, defined as the distance between closest surfaces of the wafer 100 and an external component attached to the contact pads 412A-B. Further, the trench 406 may provide an increased gap for later semiconductor manufacturing processes, such as deposition of underfill (UF) material, which may be a silicate-filled polymer to couple the die to the substrate to reduce the load on the solder joints, and waterproofing flow.

The trench 406 may be defined by a trench width T. Example widths for trench width T may be 100-1000 micrometers, 250-750 micrometers, of more particularly greater than 320 micrometers for 01005-type components or greater than 230 micrometers for 008004-type components. The trench 406 may also be defined by a trench length N. Example lengths for trench length N may be 10-500 micrometers, 50-250 micrometers, or more particularly less than 170 micrometers for 01005-type components and less than 70 micrometers for 008004-type components.

Openings 404 may be formed in pairs to facilitate forming two contact pads for coupling to two terminals of a component. Each pair of contact pads 412A and 412B may be sized and spaced to facilitate coupling of different sizes of components. The contact pads 412A and 412B may be separated by a distance P on a wafer 100 through a first dielectric layer 408 and a second dielectric layer 410. Example distances for the pad-to-pad opening P may be 10-1000 micrometers, 50-500 micrometers, 100-200 micrometers, or more particularly 100 micrometers for 008004-type components or 200 micrometers for 01005-type components. The pair of contact pads 412A and 412B may also be characterized by a dielectric opening total length L between an outside edge of opening 404 corresponding to contact pad 412B and an outside edge of opening 404 corresponding to contact pad 412A. Example distances for the dielectric opening total length L include from 1.5 to 5 times the dimension P, from 2 to 3 times the dimension P, or more particularly, from between 2.5 to 3 times the dimension P for 01005-type components and between 3 to 3.5 times the dimension P for 008004-type components. The pair of contact pads 412A and 412B may further be characterized by a dielectric opening width W between opposing outside edges of opening 404 of one of the contact pads 412A and 412B. Example distances for the dielectric opening width W include from 50-500 micrometers, 100-350 micrometers, or more particularly, 230 micrometers for a 01005-type component or 140 micrometers for a 008004-type component. The overlap 422 may have a width O between an edge of the conductive terminal 402 and the opening 404. Example widths for pad-to-dielectric opening O may be 5-500 micrometers, 10-100 micrometers, or more particularly, greater than 15 micrometers for 008004-type components or greater than 15 micrometers for 01005-type components.

Figure 5A:
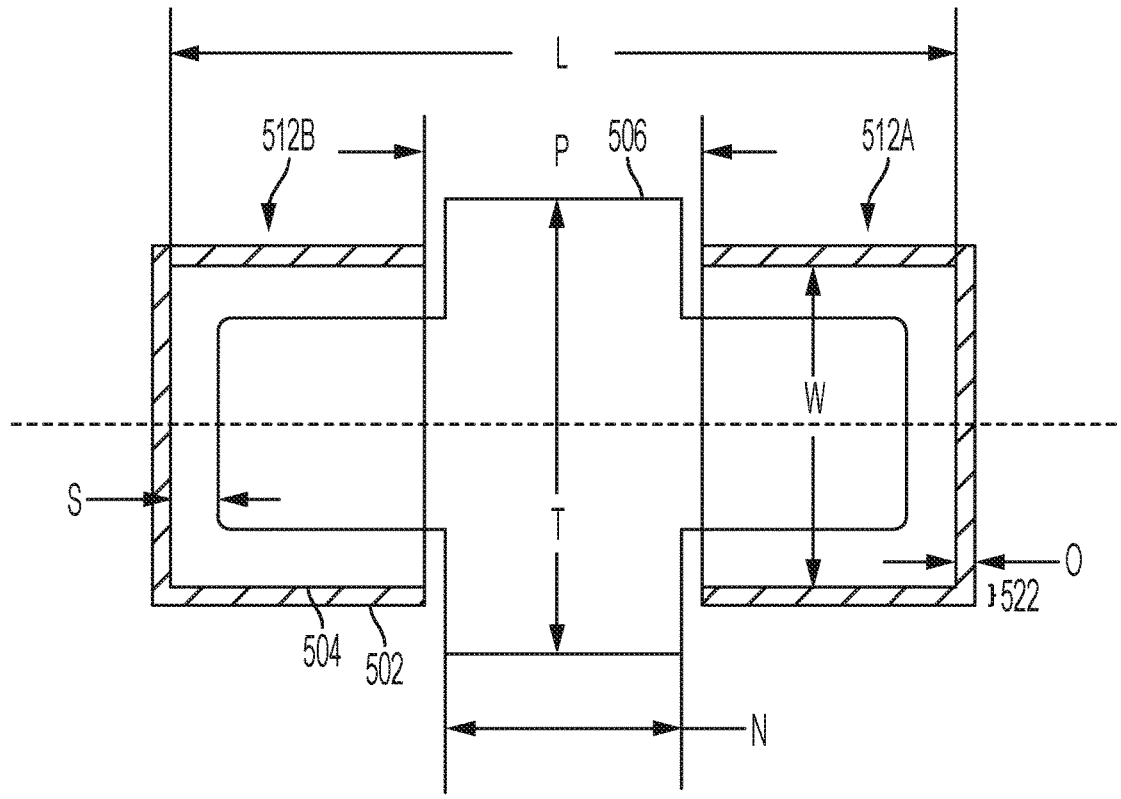
FIGS. 5A-B are a top-down view and a cross-sectional view, respectively, of example contact pads with a conductive pad on an active side of the wafer according to embodiments of the disclosure.
Figure 5B:
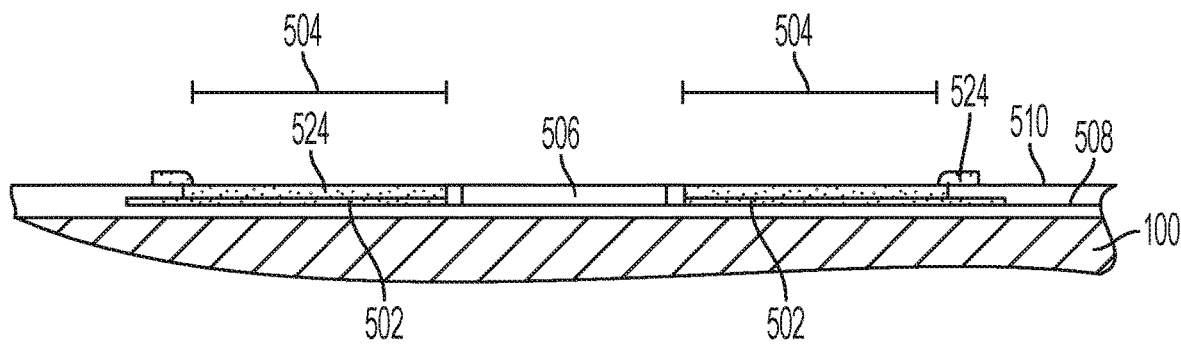

In some embodiments, conductive pads may be deposited in the openings. FIGS. 5A-B are a top-down view and a cross-sectional view, respectively, of contact pads with a conductive pad on an active side of the wafer according to embodiments of the disclosure. Contact pads 512A and 512B may correspond to, for example, contact pads 114A-B of FIG. 1 or contact pads 116A-B of FIG. 1. A cross-section of contact pads 512A and 512B through the dashed line is shown in FIG. 5B.

A conductive terminal 502 is located over and on a first dielectric layer 508. The conductive terminal 502 may be part of a redistribution layer (RDL) along with other conductive material on the same layer in a stack on the substrate. For example, a RDL layer may include the conductive terminals as input/output (I/O) pads of an integrated circuit on the wafer 100 with the conductive terminal 502 is located in a different lateral location from the component (e.g., a transistor) coupled to the conductive terminal 502. The second dielectric layer 510 partially covers the conductive terminal 502 in overlap region 522. An opening 504 is formed in the second dielectric layer 510 to expose the conductive terminal 502. The opening 504 provides an area through which a component may be electrically coupled to the conductive terminal 502. The conductive terminal 502 may be coupled to circuitry on the wafer through conductive layers, including interconnects, trenches, and vias. The opening 504 in the second dielectric layer 510 defines the contact pads 512A and 512B. The second dielectric layer 510 may also be referred to as a passivation layer, thus the contact pads 512A and 512B may be described as passivation-defined.

A trench 506 in the second dielectric 504 may optionally be present. The trench 506 may be defined by a trench width T. Example widths for trench width T may be 100-1000 micrometers, 250-750 micrometers, or more particularly greater than 320 micrometers for 01005-type components or greater than 230 micrometers for 008004-type components. The trench 506 may also be defined by a trench length N. Example lengths for trench length N may be 10-500 micrometers, 50-250 micrometers, or more particularly less than 170 micrometers for 01005-type components and less than 70 micrometers for 008004-type components. The trench 506 provides the same advantages to the embodiments of FIGS. 5A-5B as with the embodiments of FIGS. 4A-4B.

A conductive pad may be deposited in the opening 504 to form an electrically coupling point that is approximately at or above a height of the second dielectric layer 510. For example, conductive pad 524 may be formed in the openings 504 and partially overlapping the second dielectric layer 510 at some or all edges of the opening 504 and substantially fill the opening 504. In some embodiments, the conductive pad 524 is an underbump metallization (UBM) pad. The conductive pad 524 may be defined by a pad to RDL gap distance O. Example pad to RDL Gap distance O may be 5-500 micrometers, 15-250 micrometers, or more particularly greater than 15 micrometers for 01005-type components or greater than 15 micrometers for 008004-type components. The conductive pad 524 may also be defined by a Pad to Pad distance P. Example distance P values may be 10-1000 micrometers or 50-500 micrometers, or more particularly 230 micrometers for 01005-type components or 100 micrometers for 008004-type components. The conductive pad 524 may further be defined by a pad width W. Example widths for pad width W may be 50-500 micrometers, 100-250 micrometers, or more particularly 230 micrometers for 01005-type components or 140 micrometers for 008004-type components.

The use of conductive pad 524 may reduce risk of conductive pad consumption during coupling of a component to the contact pads 512A and 512B by increasing a total thickness of conductor on the contact pads 512A and 512B. For example, the total thickness of conductive material is a sum of the thicknesses of the contact terminal 502 and the conductive pad 524. Further, the conductive pad 524 may improve board level reliability (BLR) performance. The improved BLR performance may result from the reduced likelihood of conductor consumption and/or decreased resistance of the electrical coupling between the component and the contact pads 512A and 512B with the conductive pad 524 present.

Openings 504 may be formed in pairs to facilitate forming two contact pads for coupling to two terminals of a component. Each pair of contact pads 512A and 512B may be sized and spaced to facilitate coupling of different sizes of components. The contact pads 512A and 512B may be separated by a distance P on a wafer 100 through a first dielectric layer 508 and a second dielectric layer 510. Example distances for the pad-to-pad opening P may be 10-1000 micrometers, 50-500 micrometers, 100-200 micrometers, or more particularly 100 micrometers for 008004-type components or 200 micrometers for 01005-type components. The pair of contact pads 512A and 512B may also be characterized by a dielectric opening total length L between an outside edge of opening 504 corresponding to contact pad 512B and an outside edge of opening 504 corresponding to contact pad 512A. Example distances for the dielectric opening total length L include from 1.5 to 5 times the dimension P, from 2 to 3 times the dimension P, or more particularly, from between 2.5 to 3 times the dimension P for 01005-type components and between 3 to 3.5 times the dimension P for 008004-type components. The pair of contact pads 512A and 512B may further be characterized by a dielectric opening width W between opposing outside edges of opening 504 of one of the contact pads 512A and 512B. Example distances for the dielectric opening width W include from 50-500 micrometers, 100-350 micrometers, or, more particularly, 230 micrometers for a 01005-type component or 140 micrometers for a 008004-type component. The overlap 522 may have a width O between an edge of the conductive terminal 502 and the opening 504. Example widths for pad-to-dielectric opening O may be 5-500 micrometers, 10-100 micrometers, or more particularly, greater than 15 micrometers for 008004-type components or 01005-type components.

Figure 6A:
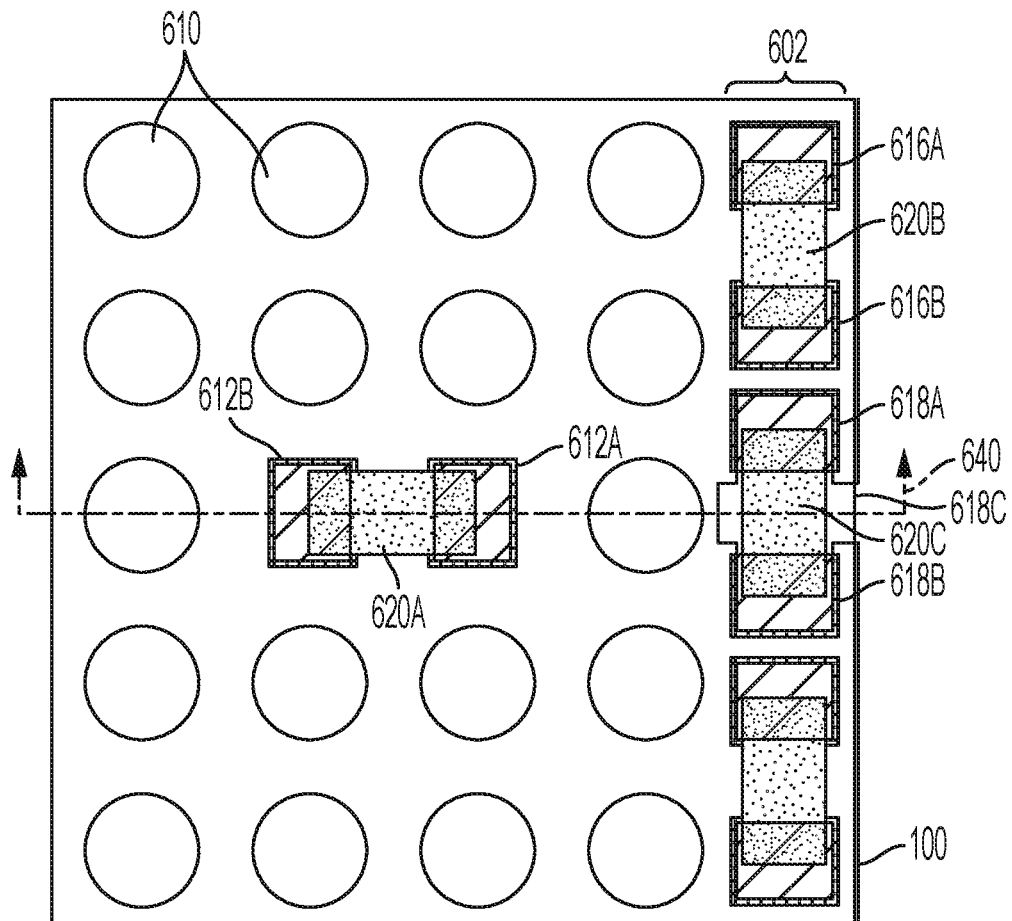
FIGS. 6A-B are a top-down view and a cross-sectional view, respectively, of an example wafer having components coupled to pairs of the contact pads on an active side of the wafer according to embodiments of the disclosure.
Figure 6B:
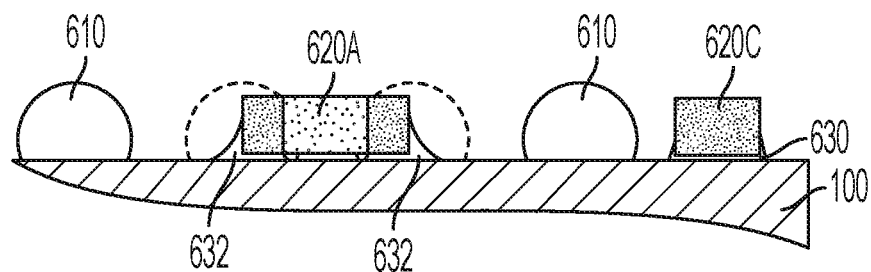

In some embodiments, the configurations for contact pads described herein may be used in an arrangement having one component per two depopulated packaging connections, which may accommodate larger components than the example of FIGS. 1-2. Larger components may support larger capacitances, inductances, resistances, current capacities, voltage differentials, or other characteristics for components. FIGS. 6A-B are a top-down view and a cross-sectional view, respectively, of a wafer having components coupled to pairs of the contact pads on an active side of the wafer according to embodiments of the disclosure. A cross-section through wafer 100 along line 640 of FIG. 6A is shown in FIG. 6B.

A grid of packaging connections 610 may be present on an active side of the wafer 100. Contact pads 612A and 612B may be substituted for two depopulated balls of the packaging connection. A component 620A may couple to circuitry on the wafer 100 through the contact pads 612A and 612B and solder 632. Components 620B and 620C may be located at an edge 602 of a die of the wafer 100. The components 620B and 620C may be coupled to circuitry on the wafer 100 through contact pads 616A-B and 618A-B, respectively, by solder 630. In some embodiments, the contact pads 612A and 612B may be sized to fit in an arrangement having two components for each location in a grid of packaging connections 610. In some embodiments, the size may correspond to 01005-type components on a 0.4 mm pitch.

In some embodiments, the sizes and spacings of contact pads between different locations on the wafer 100 may be different. The sizing and spacing may be based on a size of component matching desired characteristics for the component used by the circuitry coupled to the component. For example, in a first portion of an integrated circuit designed for use with a small capacitor, two packaging connections may be depopulated and two capacitor components placed in the depopulated connections and in a second portion of the integrated circuit designed for use with a large capacitor, two packaging connections may be depopulated and one capacitor component placed in the depopulated connections. Other ratios of depopulated connections to placed components than those described in embodiments herein may also be used.

Figure 7:
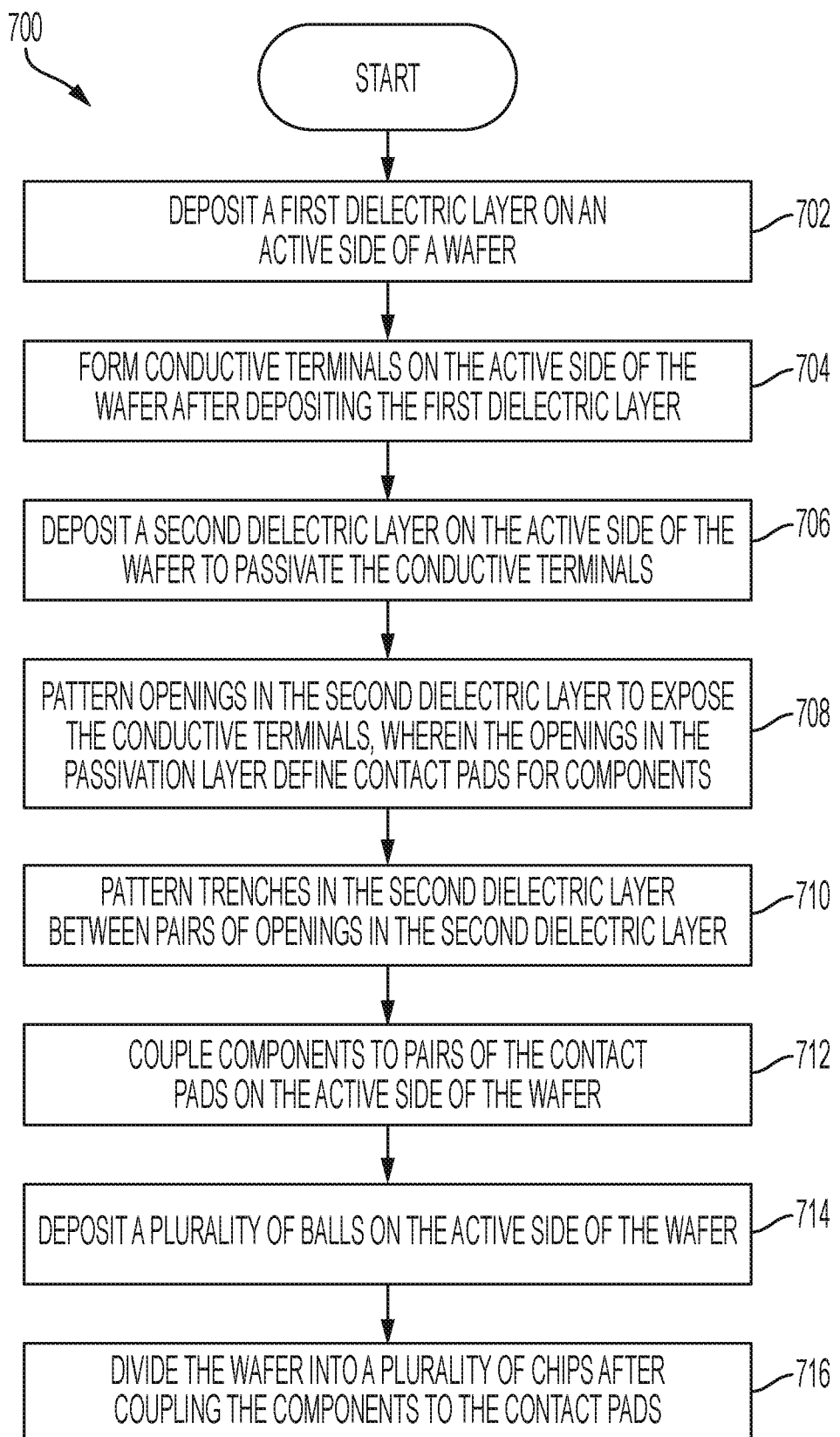
FIG. 7 is a flow chart illustrating an example method of fabricating dies with components coupled to an active side of the wafer according to embodiments of the disclosure.

An example method of forming contact pads on an active side of a wafer, such as in a wafer-level chip scale packaging (WLCSP), is shown in FIG. 7. FIG. 7 is a flow chart illustrating a method of fabricating dies with components coupled to an active side of the wafer according to embodiments of the disclosure. At block 702, a first dielectric layer is deposited on an active side of the wafer after formation of circuitry and conductive layers for interconnects on the active side. Referring to FIG. 4B, an example of such a first dielectric layer is layer 408. Example materials for the dielectric layer include silicon dioxide, silicon nitride, and polymer-based dielectrics. Example thicknesses for the dielectric layer are 5-15 um for polymer-based dielectrics and 2-5 micrometers thick for Silicon dioxide or Silicon nitride.

At block 704, conductive terminals are formed on an active side of the wafer after depositing the first dielectric layer. Referring to FIG. 4B, an example of such a conductive terminal is conductive terminal 402. The conductive terminals may be formed through masked deposition to create small regions of conductive material. The conductive terminals may alternatively be formed by deposition of a conformal conductive layer, followed by deposition of a photoresist material, exposure of the photoresist material through a mask defining the openings, and etching of the conformal layer using the photoresist or an intermediate layer to form patterned conductive terminals. Example materials for the conductive terminal are copper, aluminum, tungsten, and alloys thereof. Example thicknesses for the conductive terminal are 5-15 micrometers thick.

At block 706, a second dielectric layer is deposited on the active side of the wafer on the conductive terminals and on the first dielectric layer. The second dielectric layer may be deposited as a conformal layer and have the same or different dielectric material as the first dielectric layer deposited at block 702. Referring to FIG. 4B, an example of such a second dielectric layer is dielectric layer 410.

At block 708, openings are formed in the second dielectric layer by patterning the second dielectric layer. The openings in this second dielectric layer, or passivation layer, may define the contact pads for components to couple to circuitry on the active side of the wafer. Referring to FIG. 4B, an example of such an opening is opening 404. In some embodiments, blocks 706 and 708 may be replaced with forming a second dielectric layer with openings through, for example, deposition of the second dielectric through a stencil mask defining openings in the second dielectric layer.

At block 710, trenches may optionally be formed in the second dielectric layer between pairs of openings in the second dielectric layer intended to couple to the same component. The trenches may be formed by depositing a photoresist layer, exposing the photoresist layer through a photomask defining the trenches, and using the patterned photoresist layer and/or an intermediate layer as a mask to etch portions of the second dielectric layer to form the trenches. In some embodiments in which trenches are formed with the contact pads, the trenches may be formed in parallel with the openings of block 708 and/or the deposition of the second dielectric layer of block 706, such as by depositing the second dielectric layer through a stencil mask that defines the openings and the trenches. In some embodiments such as shown in FIGS. 6A and 6B, a conductive pad is further deposited on the second dielectric layer and the opening. In some embodiments of a manufacturing process, the pad openings and trenches are formed at the same time with the same photolithography processes.

After the contact pads are formed, additional processing may be performed to couple components to the contact pads and prepare the wafer for use in an electronic device. At block 712, components are coupled to pairs of contact pads formed on an active side of the wafer. Example components include 01005-type components, 008004-type components, 0805-type components, 0603-type components, 0402-type components, and 0201-type components. The coupling of block 712 may include, for example, affixing the component with solder. At block 714, a packaging connection such as a plurality of balls may be deposited on the active side of the wafer. At block 716, the wafer may be divided into a plurality of dies after coupling the components to the wafer at block 714. The dies may be packaged as chips and incorporated into electronic devices, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like. Portions of the method 700 relating to coupling of components to the circuitry on the active side of the wafer are performed prior to the dividing of the wafer, such that the steps are referred to as wafer-level chip-scale packaging (WLCSP).

Figure 8:
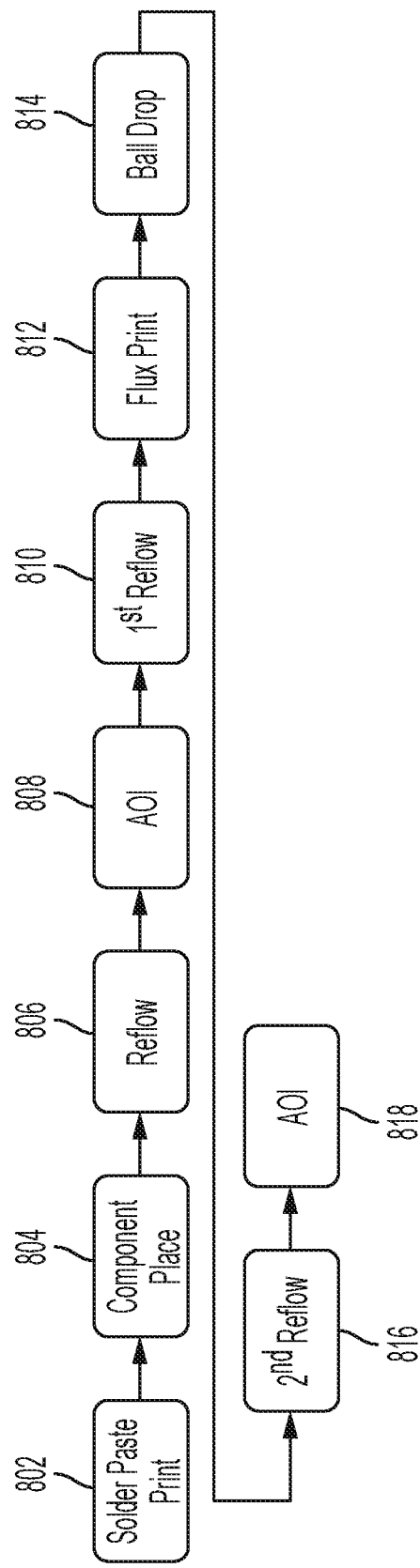
FIG. 8 is a flow chart illustrating an example method of forming contact pads on an active side of a wafer with component placement and reflow according to embodiments of the disclosure.
Figure 9:
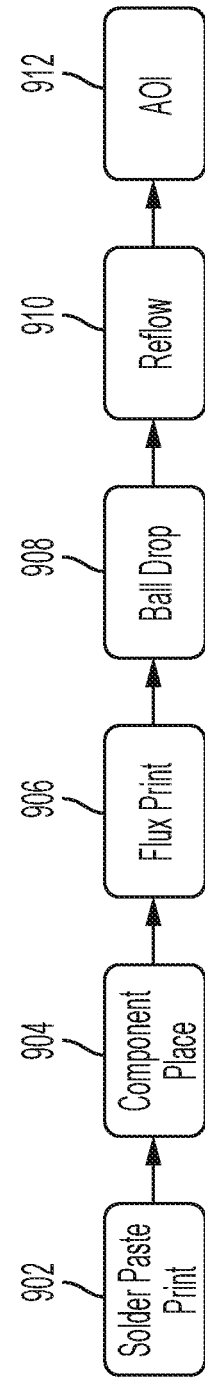
FIG. 9 is a flow chart illustrating an example method of forming contact pads on an active side of a wafer with component placement and ball drop reflow in parallel according to embodiments of the disclosure.

Some embodiments of the manufacturing technique described above with regard to FIG. 7 may be performed beginning at the coupling of components at block 712 in accordance with the embodiments of FIG. 8 and FIG. 9. In one embodiment, component place and reflow may be performed first as shown in FIG. 8. FIG. 8 is a flow chart illustrating a method of forming contact pads on an active side of a wafer with component placement and reflow according to embodiments of the disclosure. A method may begin at block 802 with solder paste printing, followed by component placement at block 804, reflow at block 806, automated optical inspection (AOI) at block 808, a first reflow at block 810, a flux print at block 812, a ball drop (e.g., deposition of a packaging connection) at block 814, a second reflow at block 816, and a subsequent automated optical inspection (AOI) at block 818.

In some embodiments, the component and ball drop reflows may be performed in parallel at block 910 as shown in FIG. 9. FIG. 9 is a flow chart illustrating a method of forming contact pads on an active side of a wafer with component placement and ball drop reflow in parallel according to embodiments of the disclosure. A method may begin at block 902 with solder paste printing, followed by component placement at block 904, a flux print at block 906, a ball drop at block 908, a reflow at block 910, and an automated optical inspection (AOI) at block 912. The parallel reflow at block 910 in the method of FIG. 9 reflows the component placement of block 904 and the ball drop of block 908, which may reduce the number of processing steps and thus decrease manufacturing costs.

Figure 10:
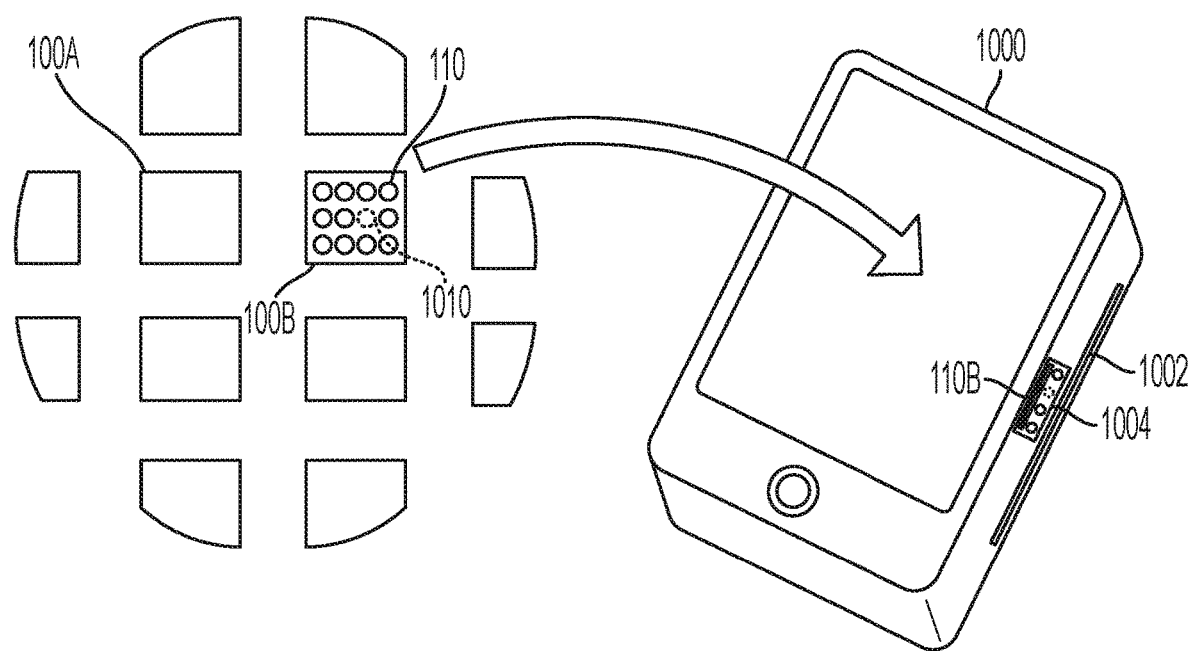
FIG. 10 is a sketch of an example mobile device with an integrated circuit (IC) chip with components coupled to an active side of the wafer according to embodiments of the disclosure.

One example of a packaged chip including components coupled to an active side of the wafer during wafer-level chip scale packaging (WLCSP) as part of an electronic device is shown in FIG. 10 with regard to a mobile phone. FIG. 10 is a sketch of a mobile device with an integrated circuit (IC) chip with components coupled to an active side of the wafer according to embodiments of the disclosure. A wafer manufactured according to embodiments of the WLCSP process described herein may be diced into individual dies 100A and 100B. Each of the dies may include packaging connections 110 and depopulated packaging connections 1010. Components may be coupled to circuitry on the die 100B through contact pads, such as shown in FIG. 3A, FIG. 4A, FIG. 5A, and other embodiments described herein, formed in the region of depopulated packaging connections 1010.

The separated dies 100A and 100B may be packaged into chips for use in electronic devices. For example, the die 100B may be packaged into a chip 1004 and attached to a printed circuit board (PCB) 1002 of a mobile device 1000. The chip 1004 may provide functionality to the mobile device 1000 through a combination of circuitry on the die 100B and components coupled to the active side of the die 100B using contact pads such as described herein. Some example functionality for chip 1004 include a central processing unit (CPU), memory, a graphics processing unit (GPU), an audio controller (e.g., a coder/decoder (CODEC), an analog-to-digital converter (ADC), a digital-to-analog converter (DAC)), and/or a wireless communications module (e.g., a cellular modem, a Wi-Fi adaptor, a Bluetooth adaptor). Although a mobile device 1000 is shown incorporating the die 110B including contact pads described in embodiments herein, the die 110B may be packaged and included in other electronic devices including music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like.

The described methods, including the methods depicted in FIG. 7, FIG. 8, and FIG. 9 are generally set forth in a logical flow of steps. As such, the described order and labeled steps of representative figures are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As another example, although processing of audio data is described in some embodiments, integrated circuits (ICs) for performing other processing tasks on other types of data may be manufactured using the structures and methods described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   depositing a first dielectric layer on an active side of a wafer;
   forming conductive terminals on the active side of the wafer after depositing the first dielectric layer;
   depositing a second dielectric layer on the active side of the wafer to passivate the conductive terminals;
   patterning openings in the second dielectric layer to expose the conductive terminals, wherein the openings define contact pads for external components;
   patterning trenches in the second dielectric layer between pairs of the openings in the second dielectric layer;
   coupling the external components to the pairs of contact pads on the active side of the wafer; and
   dividing the wafer into a plurality of chips after coupling the external components to the contact pads.

2. The method of claim 1, wherein each external component of the external components are smaller in size than an outer dimension of each pair of contact pads of the pairs of contact pads to which each external component is coupled.

3. The method of claim 1, further comprising depositing a conductive pad above the conductive terminals and coupled to the conductive terminals.

4. The method of claim 3, wherein depositing a conductive pad comprises depositing an under bump metallization (UBM) pad.

5. The method of claim 1, wherein depositing a first dielectric layer comprises depositing a first polymer-based dielectric layer, and wherein depositing a second dielectric layer comprises depositing a second polymer-based dielectric layer.

6. The method of claim 1, further comprising depositing a plurality of balls on the active side of the wafer before dividing the wafer into a plurality of chips, wherein the plurality of balls are organized in a grid pattern, the grid pattern also comprising a plurality of depopulated ball locations, and wherein two pairs of the pairs of contact pads are arranged in the grid pattern for each of the plurality of depopulated ball locations.

7. The method of claim 1, further comprising depositing a plurality of balls on the active side of the wafer before dividing the wafer into a plurality of chips, wherein the plurality of balls are organized in a grid pattern, the grid pattern also comprising a plurality of depopulated ball locations, and wherein a pair of the pairs of contact pads is arranged in the grid pattern for each of the plurality of depopulated ball locations.

8. The method of claim 1, further comprising depositing a plurality of balls on the active side of the wafer before dividing the wafer into a plurality of chips, wherein the plurality of balls comprises a first plurality of balls corresponding to a first chip to be divided from the wafer and a second plurality of balls corresponding to a second chip to be divided from the wafer, wherein the contact pads are located on a portion of the wafer between the first plurality of balls and the second plurality of balls such that components corresponding to the first chip are located at a chip edge of the first chip when the first chip is divided from the wafer.

9. An apparatus, comprising:
   a substrate;
   a first dielectric layer on the substrate;
   conductive terminals on the first dielectric layer;
   a second dielectric layer on the first dielectric layer and on the conductive terminals;
   openings in the second dielectric layer above the conductive terminals forming pairs of contact pads for external components, wherein trenches are included in the second dielectric layer between pairs of the openings; and
   the external components coupled to the pairs of contact pads.

10. The apparatus of claim 9, wherein each external component of the external components are smaller in size than an outer dimension of each pair of contact pads of the pairs of contact pads to which each external component is coupled.

11. The apparatus of claim 10, further comprising a conductive pad above the conductive terminals and coupled to the conductive terminals.

12. The apparatus of claim 11, wherein the conductive pad comprises an underbump metallization (UBM) pad.

13. The apparatus of claim 9, wherein the first dielectric layer comprises a first polymer-based dielectric layer, and wherein the second dielectric layer comprises a second polymer-based dielectric layer.

14. The apparatus of claim 9, further comprising a plurality of balls organized in a grid pattern, the grid pattern also comprising a plurality of depopulated ball locations, wherein two pairs of the pairs of contact pads are arranged in the grid pattern as a substitute for each of the plurality of depopulated ball locations.

15. The apparatus of claim 9, further comprising a plurality of balls organized in a grid pattern, the grid pattern also comprising a plurality of depopulated ball locations, wherein a pair of the pairs of contact pads is arranged in the grid pattern as a substitute for two of the plurality of depopulated ball locations.

16. The apparatus of claim 9, further comprising a plurality of balls, wherein the external components are located at a chip edge.

17. The apparatus of claim 9, wherein the substrate comprises semiconductor transistors on an active side of the substrate, and wherein the external components are located on the active side of the substrate.

18. The apparatus of claim 9, wherein the apparatus comprises a mixed signal device comprising analog signal processing components and digital signal processing components.

* * * * *